United States Patent
Lee et al.

(10) Patent No.: US 6,337,567 B1
(45) Date of Patent: Jan. 8, 2002

(54) APPARATUS AND METHOD FOR MEASURING SECOND-ORDER GRADIENT OF MAGNETIC FIELD USING SUPER CONDUCTOR QUANTUM INTERFERENCE DEVICE

(75) Inventors: Seung Min Lee; Seung Hyun Moon, both of Kyonggi-do; Byung Du Oh, Seoul, all of (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/563,720

(22) Filed: May 3, 2000

(30) Foreign Application Priority Data

Apr. 22, 1999 (KR) ............................................. 99-14500

(51) Int. Cl.[7] ..................... G01R 33/022; G01R 33/035
(52) U.S. Cl. .......................... 324/248; 505/162; 505/846
(58) Field of Search ........................ 324/248; 505/162, 505/846

(56) References Cited

U.S. PATENT DOCUMENTS 5,194,807 A  *  3/1993  Ueda .......................... 324/248

FOREIGN PATENT DOCUMENTS

EP            0-481211 A2  *  4/1992

* cited by examiner

Primary Examiner—Safet Metjahic
Assistant Examiner—Reena Aurora
(74) Attorney, Agent, or Firm—Morgan, Lewis & Bockius LLP

(57) ABSTRACT

An apparatus and method for measuring a second-order gradient of a magnetic field using a super conductor quantum interference device (SQUID) which obtains the second-order gradient of the magnetic field with a simple-constructed and low-priced measuring apparatus having three SQUID sensors and one differential circuit only. The apparatus includes first to third SQUID sensor driving circuits for detecting respective surrounding magnetic fields and outputting corresponding currents, respectively, a first coil for producing a magnetic field according to the current outputted from the first SQUID sensor driving circuit and feeding the produced magnetic field back to the first SQUID sensor driving circuit, a second coil for producing a magnetic field according to a sum of the currents outputted from the first and second SQUID sensor driving circuits and feeding the produced magnetic field back to the second SQUID sensor driving circuit, a third coil for producing a magnetic field according to a sum of the currents outputted from the second and third SQUID sensor driving circuits and feeding the produced magnetic field back to the third SQUID sensor driving circuit, and a differential amplifying section for differential-amplifying voltages outputted from the second and third SQUID sensor driving circuits.

9 Claims, 3 Drawing Sheets

APPARATUS AND METHOD FOR MEASURING SECOND-ORDER GRADIENT OF MAGNETIC FIELD USING SUPER CONDUCTOR QUANTUM INTERFERENCE DEVICE

BACKGROUND OF THE INVENTION

1. Field of the Invention

The present invention relates generally to a magnetic field measuring apparatus. In particular, the present invention relates to an apparatus and method for measuring a second-order gradient of a magnetic field using a super conductor quantum interference device (SQUID) which obtains the second-order gradient of the magnetic field with a simple-constructed and low-priced measuring apparatus having three SQUID sensors and one differential circuit only.

2. Description of the Related Art

The SQUID is an element which can respond to the change of a weak magnetic field based on the quantum interference effect of flux, and is used in a flux meter or a biosensor.

However, the SQUID has the problems in that since the source of a magnetic field is in the form of a dipole, the attenuation of the magnetic field according to a distance becomes severe, and it becomes more severe especially in case that the size of the magnetic field is smaller than that of the surrounding environment such as biomagnetism.

In order to solve the problems of the magnetic field attenuation, a sensor is brought close to a signal source, and a gradient type signal, which is a differential value for a space, is measured by the sensor. This measurement is technically simple, and advantageous in sensing the change of the signal source according to a time in a local space.

As shown in FIG. 1a, a basic DC SQUID, which is a device for measuring a magnetic field, comprises a super conductor loop C that has a small inductance and includes two super conductor junctions A and B.

The electromagnetic characteristic of the DC SQUID is that when a DC bias current Io flows through the two super conductor junctions A and B, the voltage VJ of the super conductor junctions A and B is changed according to the flux $\Phi a$ passing through the loop C of the SQUID as shown in FIG. 1b.

For instance, if the voltage of the super conductor junction A is $V_A$, and the voltage of the super conductor junction B is $V_B$, the changed voltage VJ will be $V_A - V_B$. Also, the voltage VJ appears as a function of flux that oscillates with a period of one flux quantum $\Phi a$ as shown in FIG. 1c.

Most apparatuses for measuring a magnetic field using the SQUID as described above includes a flux locked loop, which is a feedback section for maintaining the amount of flux passing through the SQUID loop to be always constant.

The conventional magnetic field measuring apparatus using the SQUID is briefly classified into three methods.

The first method connects to the SQUID and measures the current picked up according to the difference between magnetic fields produced by two space-apart pickup coils when the magnetic fields are produced from the two coils, respectively. The second method converts outputs of two magnetic sensors into electric signals or digital signals, and subtracts one converted output value from the other. The third method is an active compensation method for artificially forming a magnetic field which is opposite to the magnetic field exerted on a reference magnetic sensor with respect to other magnetic sensors based on a signal obtained from an output of the reference magnetic sensor, and sensing only the difference therebetween.

According to the third method, the offset of the magnetic field is primarily performed by reading out the magnetic field of the reference sensor from the magnetic field surrounding the SQUID and applying to other sensors a magnetic field which has the opposite direction to and the same size as the magnetic field of the reference sensor, and thus it is not required to heighten the dynamic range with respect to other circuits except the reference sensor.

As described above, an effective measuring apparatus can be produced by employing the third method, which is used for measuring the first-order gradient using three sensors including one reference sensor and two differential sensors.

However, according to the first method, though the measurement of the magnetic field is possible by using low-noise pickup coils in case of a low-temperature SQUID, it is technically difficult to make desired types of pickup coils since the pickup coils of a good quality can be made in the form of a thin film in case of a high-temperature SQUID.

According to the second method, the ratio of the dynamic range to sensitivity of a respective readout circuit, i.e., the signal-to-noise (S/N) ratio, should become great in order to sufficiently use the sensitivity in the general environment. This S/N ratio should have the size of 23 bits which corresponds to more than 140 dB since the magnetic field strength in the general environment is about $10^{-6}$T, and the sensitivity of the general high-temperature SQUID is about $10^{-13}$T.

It is technically difficult to implement the readout circuits having a very large S/N ratio as above. Also, the common mode rejection ratio (CMRR) of the differential circuit should become great in proportion to the S/N ratio of the readout circuit, but the CMRR of the differential amplifier is limited in case that a large DC magnetic field is commonly exerted on the respective sensors.

Also, in order to measure the second-order gradient by the third method, it is not required for the three driving circuits to have a high S/N ratio as in the second method, but more than three differential amplifiers and associated digital calculation are still required as well as 7 coils.

Also, according to the third method, the M (proportional constant of the current applied to coils and the magnetic field produced by the current) value of the three coils with respect to the reference sensor should be adjusted, and two among the three circuits should be re-adjusted to equally correcting the driving circuits of the three sensors, thereby requiring a number of adjustment steps.

SUMMARY OF THE INVENTION

Accordingly, the present invention is directed to an apparatus and method for measuring a second-order gradient of a magnetic field using a SQUID that substantially obviate one or more of the problems due to limitations and disadvantages of the related art.

An object of the present invention is to provide an apparatus and method for measuring a second-order gradient of a magnetic field using a SQUID which obtains the second-order gradient of the magnetic field with a simple-constructed and low-priced magnetic field measuring apparatus that can be used in the general environment and has three SQUID sensors and one differential circuit only.

Additional features and advantages of the invention will be set forth in the description which follows, and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, the apparatus for measuring a second-order gradient of a magnetic field using a SQUID according to the present invention includes first to third SQUID sensor driving circuits for detecting respective surrounding magnetic fields and outputting corresponding currents, respectively, a first coil for producing a magnetic field according to the current outputted from the first SQUID sensor driving circuit and feeding the produced magnetic field back to the first SQUID sensor driving circuit, a second coil for producing a magnetic field according to a sum of the currents outputted from the first and second SQUID sensor driving circuits and feeding the produced magnetic field back to the second SQUID sensor driving circuit, a third coil for producing a magnetic field according to a sum of the currents outputted from the second and third SQUID sensor driving circuits and feeding the produced magnetic field back to the third SQUID sensor driving circuit, and a differential amplifying section for differential-amplifying voltages outputted from the second and third SQUID sensor driving circuits.

In another aspect of the apparatus for measuring a second-order gradient of a magnetic field using a SQUID according to the present invention, the respective SQUID sensor driving circuits are connected to the first to third coils, respectively, and one of the SQUID sensor driving circuits acts as a reference sensor, while the remaining two thereof act as differential sensors.

In still another aspect of the apparatus for measuring a second-order gradient of a magnetic field using a SQUID according to the present invention, first and second bypass variable resistors are connected in parallel to the second and third coils, respectively.

In still another aspect of the apparatus for measuring a second-order gradient of a magnetic field using a SQUID according to the present invention, the first to third coils are connected in series.

In still another aspect of the apparatus for measuring a second-order gradient of a magnetic field using a SQUID according to the present invention, the reference sensor is located at the first or last position of the sensors.

In still another aspect of the present invention, there is provided a method for measuring a second-order gradient of a magnetic field using a SQUID comprising the steps of positioning first to third SQUID sensors which are driven in a feedback manner at equal intervals, connecting in series a first feedback coil connected to the first SQUID sensor, a second feedback coil the first feedback coil and a current applied to the second feedback coil and accumulating the added current in the second feedback coil, adding a current applied to the second feedback coil and a current applied to the third feedback coil and accumulating the added current in the third feedback coil, producing magnetic fields according to the accumulated currents in the first to third feedback coils and feeding the produced magnetic fields back to the first to third SQUID sensors, and obtaining a second-order gradient value using a difference between voltages produced by the second and third SQUID sensors.

In another aspect of the method for measuring a second-order gradient of a magnetic field using a SQUID according to the present invention, first and second bypass variable resistors are connected in parallel to the second and third feedback coils, respectively, and a magnetic field which is the same as the magnetic field produced in the first feedback coil is produced in the second and third feedback coils by adjusting the first and second variable resistors.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the apparatus and method for measuring a second-order gradient of a magnetic field using a SQUID according to the preferred embodiments of the present invention, examples of which are illustrated in the accompanying drawings.

Figure 1A:
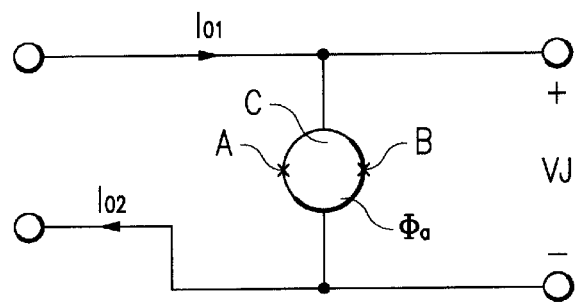
FIG. 1a is a view illustrating the structure of a general DC SQUID.
Figure 1B:
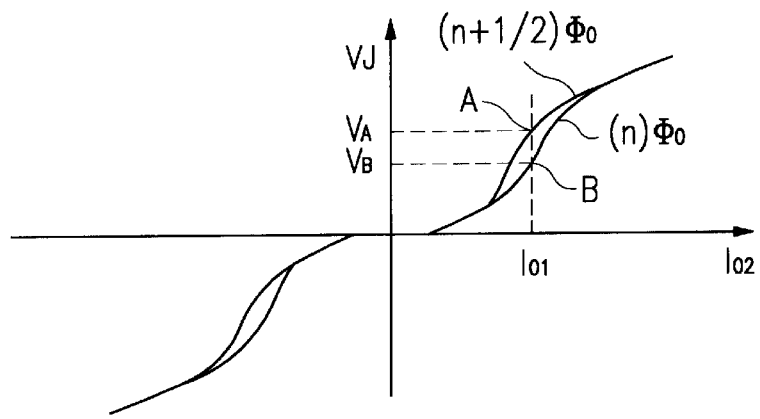
FIG. 1b is a graph illustrating the current-to-voltage characteristic of a general DC SQUID.
Figure 1C:
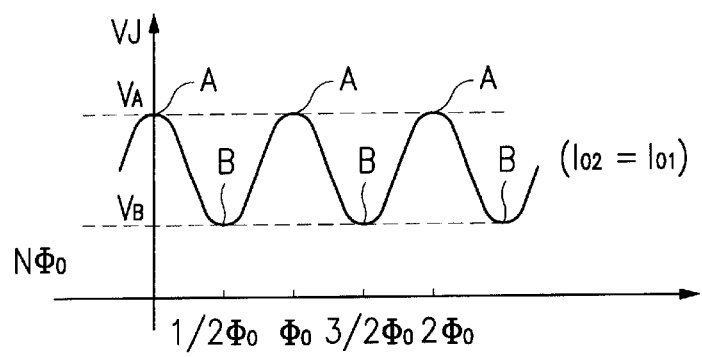
FIG. 1c is a graph illustrating the flux-to-voltage characteristic of a general DC SQUID.
Figure 2:
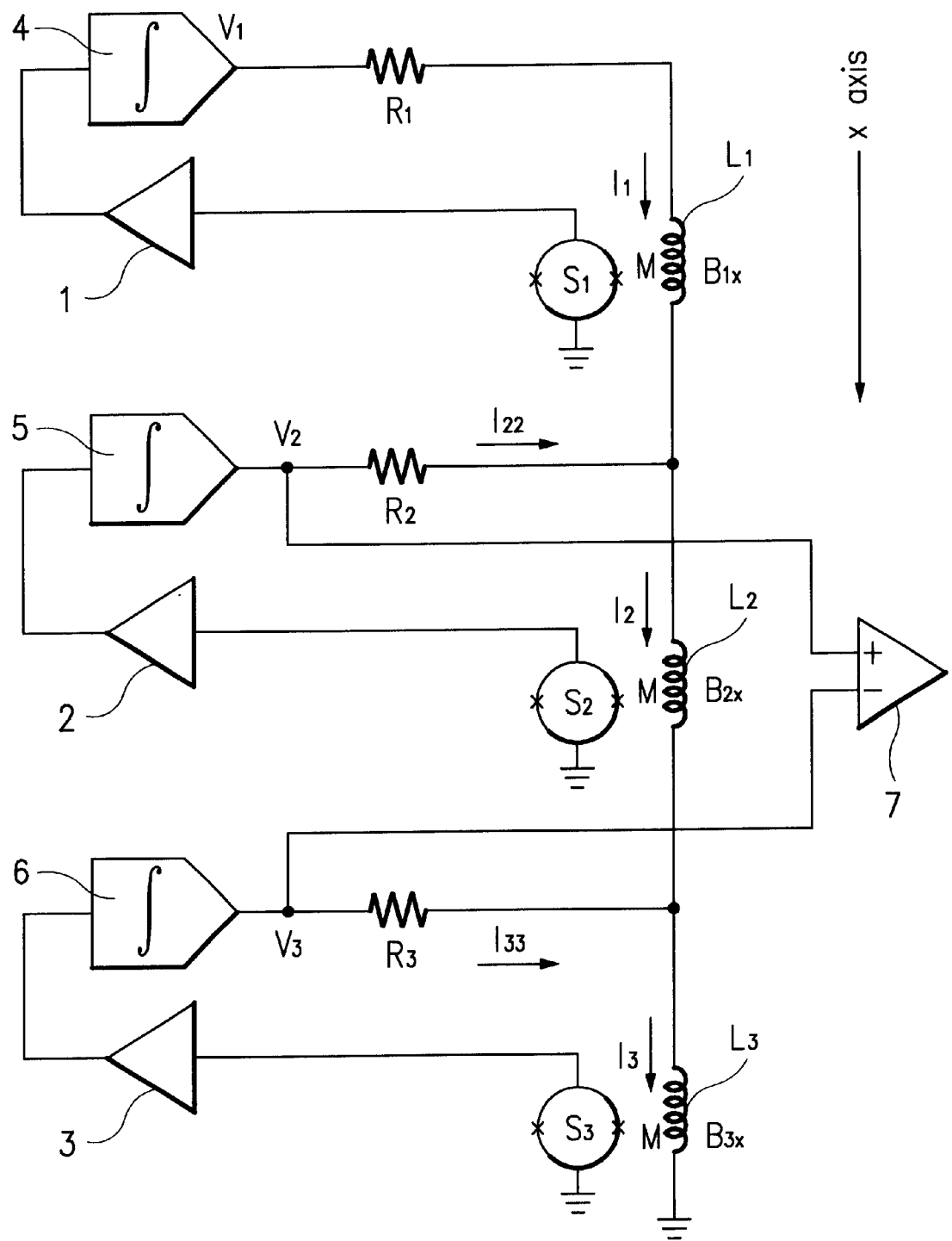
FIG. 2 is a schematic circuit diagram of the apparatus for measuring a second-order gradient of a magnetic field using a SQUID according to the present invention.

FIG. 2 is a schematic circuit diagram of the apparatus for measuring a second-order gradient of a magnetic field using a SQUID according to the present invention.

Referring to FIG. 2, the magnetic field measuring apparatus comprises three SQUIDs $S_1$, $S_2$, and $S_3$, three amplifiers 1, 2, and 3 for amplifying voltages outputted from the SQUIDs $S_1$, $S_2$, and $S_3$, respectively, three integrators 4, 5, and 6 for integrating the voltages amplified by the amplifiers 1, 2, and 3 to output integrated values, respectively, three feedback coils $L_1$, $L_2$, and $L_3$, connected in series, for applying magnetic fields to the SQUIDs $S_1$, $S_2$, and $S_3$, respectively, three resistors $R_1$, $R_2$, and $R_3$ connected between the integrators 4, 5, and 6 and the coils $L_1$, $L_2$, and $L_3$, respectively, and a differential amplifying section 7 for differential-amplifying one among outputs of the three SQUIDs $S_1$, $S_2$, and $S_3$.

Now, the operation of the magnetic field measuring apparatus as constructed above will be explained.

If an external flux $\Phi a$ passes through a loop of the SQUID $S_1$, i.e., a reference sensor which is located at the first position, a voltage is produced between both terminals of the SQUID $S_1$.

This voltage is amplified by the amplifier 1, and then outputted to the resistor $R_1$ through the integrator 4 as a voltage $V_1$ applied between both terminals of the resistor $R_1$. This output voltage $V_1$ is divided through the resistor $R_1$ and makes a current $I_1$, flow through the coil $L_1$. The current $I_1$, negatively feeds back the flux to the loop of the SQUID $S_1$ through the coil $L_1$, and this causes the total amount of flux passing through the loop of the SQUID $S_1$ to be maintained constant. The external magnetic field produced from the coil $L_1$ is denoted as $B_1x$.

An output voltage of the second SQUID $S_2$ is obtained in the same manner as the reference SQUID $S_1$. Then, the obtained voltage is amplified by the amplifier 2, and outputted to the resistor $R_2$ through the integrator 5 as a voltage $V_2$ applied between both terminals of the resistor $R_2$.

This output voltage $V_2$ is divided through the resistor $R_2$ and makes a current $I_{22}$ flow through the coil $L_2$. Accordingly, the current $I_2$ flowing through the coil $L_2$ will be the addition of the current $I_1$ outputted from the first reference sensor and the current $I_{22}$ outputted from the second sensor (i.e., $I_1+I_{22}=I_2$). The external magnetic field produced from the coil $L_2$ is denoted as $B_2x$.

An output voltage of the third SQUID $S_3$ is obtained in the same manner as described above. Then, the obtained voltage is amplified by the amplifier 3, and outputted to the resistor $R_3$ through the integrator 6 as a voltage $V_3$ applied between both terminal s of the resistor $R_3$.

This output voltage $V_3$ is divided through the resistor $R_3$ and makes a current $I_{33}$ flow through the coil $L_3$. Accordingly, the current $I_3$ flowing through the coil $L_3$ will be the addition of the current $I_2$ outputted from the second sensor and the current $I_{33}$ outputted from the third sensor (i.e., $I_2+I_{33}=I_3$). The external magnetic field produced from the coil $L_3$ is denoted as $B_3x$.

The current flowing through the respective coils $L_1$, $L_2$, and $L_3$ is proportional to the magnetic field produced according to the current. Here, the proportional constant is denoted as M.

The magnetic field in the respective SQUID sensor is the sum of the external magnetic field and the magnetic field produced by the coil, and is expressed as follows.

$$B_1x+M*I_1,\ B_2x+M*I_2,\ B_3x+M*I_3 \quad \text{Eq.(1)}$$

Also, the relationship among $I_1$, $I_2$, and $I_3$ given by $$I_1 = \frac{V_1}{R}$$
$$I_2 = I_1 + \frac{V_2}{R} = \frac{V_1+V_2}{R}$$
$$I_3 = I_2 + \frac{V_3}{R} = \frac{V_1+V_2+V_3}{R}$$

Accordingly, the output ($V_2-V_3$) of the differential amplifier 7 is given by $$V_2-V_3=(I_2-I_1)*R-(I_3-I_2)*R=-(I_3+I_1-2*I_2)*R$$

While the flux locked loop type driving circuit operates, the sum of the magnetic fields exerted on the respective sensors should be 0 (null). Thus, if the value of Eq.(1) is 0, we have $$B_1x=-M*I_1$$
$$B_2x=-M*I_2$$
$$B_3x=-M*I_3$$

Accordingly, $$V_3 - V_2 = -R*(I_1+I_3-2*I)$$

$$= \frac{(B_1x+B_3x-2*B_2x)*R}{M}$$

$$= \frac{\frac{d^2B}{dx^2}*R}{M}$$

Thus, the second-order gradient can be obtained.

In order to apply the present invention practically, it is necessary to accurately set the values of the respective parts of the measuring apparatus, and especially, it is most important to make the magnetic fields applied to the respective coils equal. That is because the magnetic fields applied to all the coils should be equal in order for the offset magnetic field outputted from the reference sensor to be accurately applied to the two remaining sensors.

According to the present invention, the effective value of M for making the magnetic fields applied to the respective coils equal is obtained using the bypass variable resistors.

Figure 3:
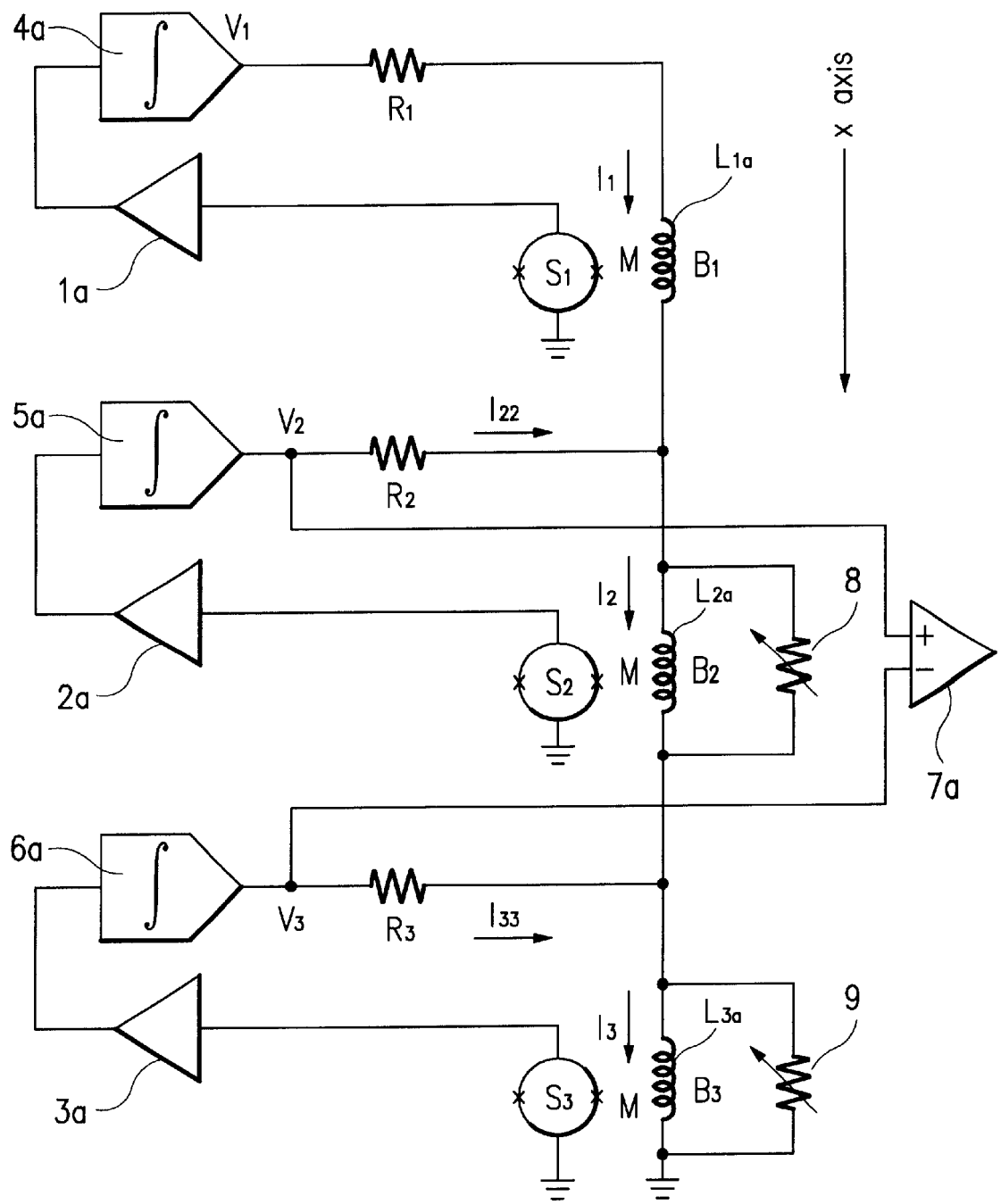
FIG. 3 is a schematic circuit diagram of the apparatus for measuring a second-order gradient of a magnetic field using a SQUID which employs bypass variable resistors according to the present invention.

FIG. 3 is a schematic circuit diagram of the apparatus for measuring a second-order gradient of a magnetic field using a SQUID which employs bypass variable resistors according to the present invention. The operation thereof is the same as that of the apparatus of FIG. 2.

Referring to FIG. 3, the method for adjusting the M value using the bypass variable resistors will now be explained.

First, if the resistance and the current of the coils $L_2a$ and $L_3a$ are $R_c$ and $I_c$, and the resistance and the current of the variable resistors 8 and 9 are $R_B$ and $I_B$, the current I inputted to the parallel connection is $$I=I_c+I_B \quad \text{Eq.(2)}$$

Since the voltages of circuits connected in parallel are equal, we have $$R_c*I_c=R_B*I$$

$$I_B = \frac{I_C*R_C}{R_B} \quad (3)$$

By substituting Eq.(3) for Eq.(2), we see that $$I = \left(\frac{1+R_C}{R_B}\right)*I_C$$

Also, since $$B = M*I_C = \frac{M*I}{1+\frac{R_C}{R_B}}$$

The effective M value ($M_{eff}$) is $$M_{eff} = \frac{M*I}{1+\frac{R_C}{R_B}}$$

Thus, the effective M value ($M_{eff}$) can be adjusted.

If the gain of the differential amplifier 7a is 1, its output is obtained by $$I_1 = \frac{V_1}{R_1}$$

$$I_2 = I_1 + \frac{V_2}{R_2} = \frac{v_1}{R_1} + \frac{v_2}{R_2}$$

$$I_3 = I_2 + \frac{V_3}{R_3} = \frac{v_1}{R_1} + \frac{v_2}{R_2} + \frac{V_3}{R_3}$$

Thus $$V_3 - V_2 = R_3 * (I_3 - I_2) - R_2 * (I_2 - I_1)$$

Here, if we make $R = R_2 = R_3$ by adjusting $R_2$ and $R_3$, we obtain $$B_1 = -M * I_1$$

$$B_2 = -M * I_2$$

$$B_3 = -M * I_3$$

Thus $$V_3 - V_2 = -R * (I_1 + I_3 - 2 * I_2)$$

$$= \frac{R * (B_1 + B_3 - 2 * B_2)}{M}$$

In practical application, the magnetic field which is the same as the magnetic field fed back to the reference SQUID $S_1$, is exerted on the remaining SQUIDs $S_2$ and $S_3$ by adjusting the bypass resistors 8 and 9.

Since there exists a great possibility that an abnormal oscillation occurs if the bandwidth of the flux locked loop of the SQUIDs $S_2$ and $S_3$ becomes equal to the bandwidth of the driving circuit of the reference SQUID $S_1$, the resistances are determined to be $R_2 = R_3 > R_1$, or the time constant of the integrators 5a and 6a is enlarged.

Also, if $R_2 = R_3 > R_1$, then $$V_1 = I_1 * R_1 = \frac{B_1 * R_1}{M}$$

$$V_2 = I_2 * R_2 = \frac{B_2 * R_2}{M}$$

Thus, the coils $L_2a$ and $L_3a$ of the SQUID sensors $S_2$ and $S_3$ are driven with a voltage higher than that of the driving circuit of the reference SQUID sensor $S_1$, and accordingly an amplified second-order gradient signal can be obtained without the gain of the differential amplifier.

Meanwhile, in order to obtain the gradient of more than third order, a simple-constructed and low-priced magnetic field measuring apparatus using a SQUID can be constructed by utilizing the method according to the present invention.

As described above, according to the apparatus and method for measuring a second-order gradient of a magnetic field using a SQUID according to the present invention, only one differential amplifier is required for measuring the second-order gradient, and the number of the driving circuits having a high S/N ratio which is required for heightening the dynamic range can be reduced to one.

Also, the number of sensors, associated driving circuits, and connection lines can be greatly reduced in comparison to the conventional apparatus. For instance, the number of coils can be reduced from 7 to 3 according to the present invention.

As a result, the SQUID measuring apparatus according to the present invention is simple-constructed and low-priced, and quickly obtains the absolute value of the second-order gradient of the magnetic field.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

What is claimed is:

1. An apparatus for measuring a second-order gradient of a magnetic field using a super conductor quantum interference device (SQUID) comprising:

a plurality of SQUID sensor driving- circuits for detecting respective surrounding magnetic fields and outputting corresponding currents, respectively;

a plurality of feedback coils for sequentially accumulating the currents outputted from the plurality of SQUID sensor driving circuits, producing magnetic fields according to the accumulated currents, and feeding the produced magnetic fields back to one of the plurality of SQUID sensor driving circuits, respectively; and a differential amplifying section for differential-amplifying at least one voltage of a plurality of voltages outputted from the plurality of SQUID sensor driving circuits.

2. The apparatus as claimed in claim 1, wherein the SQUID sensor driving circuit comprises:

a SQUID sensor for converting external flux passing through a super conductor loop into a voltage;

an amplifier for amplifying and pulse-width-modulating the voltage outputted from the SQUID sensor; and an integrator for integrating an output signal of the amplifier.

3. An apparatus for measuring a second-order gradient of a magnetic field using a super conductor quantum interference device (SQUID) comprising:

first to third SQUID sensor driving circuits for detecting respective surrounding magnetic fields and outputting corresponding currents, respectively;

a first coil for producing a magnetic field according to the current outputted from the first SQUID sensor driving circuit and feeding the produced magnetic field back to the first SQUID sensor driving circuit;

a second coil for producing a magnetic field according to a sum of the currents outputted from the first and second SQUID sensor driving circuits and feeding the produced magnetic field back to the second SQUID sensor driving circuit;

a third coil for producing a magnetic field according to a sum of the currents outputted from the second and third SQUID sensor driving circuits and feeding the produced magnetic field back to the third SQUID sensor driving circuit; and a differential amplifying section for differential-amplifying voltages outputted from the second and third SQUID sensor driving circuits.

4. The apparatus as claimed in claim 3, wherein the first to third coils are connected together in series.

5. The apparatus as claimed in claim 3, wherein the respective SQUID sensor driving circuits are connected to the first to third coils, respectively, and one of the SQUID sensor driving circuits acts as a reference sensor, while the remaining two thereof act as differential sensors.

6. The apparatus as claimed in claim 5, wherein the reference sensor is located at a first or last position among the three sensors.

7. The apparatus as claimed in claim 3, further comprising first and second bypass variable resistors connected in parallel to the second and third coils, respectively.

8. A method for measuring a second-order gradient of a magnetic field using a super conductor quantum interference device (SQUID) comprising the steps of:

positioning first to third SQUID sensors which are driven in a feedback manner at equal intervals with respect to one another;

connecting in series a first feedback coil connected to the first SQUID sensor, a second feedback coil connected to the second SQUID sensor, and a third feedback coil connected to the third SQUID sensor;

adding a current applied to the first feedback coil and a current applied to the second feedback coil, and accumulating an added current in the second feedback coil;

adding a current applied to the second feedback coil and a current applied to the third feedback coil, and accumulating an added current in the third feedback coil;

producing magnetic fields according to the accumulated currents in the first to third feedback coils, and feeding the produced magnetic fields back to the first to third SQUID sensors, respectively, and obtaining a second-order gradient value using a difference between voltages produced from the second and third SQUID sensors.

9. The method as claimed in claim 8, wherein first and second bypass variable resistors are connected in parallel to the second and third feedback coils, respectively, and a magnetic field which is the same as the magnetic field produced in the first feedback coil is produced in the second and third feedback coils, respectively, by adjusting the first and second variable resistors.

* * * * *